(12) United States Patent
Kwon

(10) Patent No.: US 6,330,138 B1
(45) Date of Patent: Dec. 11, 2001

(54) IMPEDANCE MATCHING CIRCUIT

(75) Inventor: Oh-Dong Kwon, Taegukwangyok-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/332,132

(22) Filed: Jun. 14, 1999

(30) Foreign Application Priority Data

Jun. 12, 1998 (KR) .................................................. 98-21901

(51) Int. Cl.$^7$ ...................................................... H02H 9/00
(52) U.S. Cl. ............................. 361/58; 361/118; 333/124
(58) Field of Search ................................. 361/58, 111, 56, 361/91.1, 117–119; 333/32, 193–196, 117, 175, 124, 126, 129

(56) References Cited

U.S. PATENT DOCUMENTS

| | | |
|---|---|---|
| 3,611,198 * 10/1971 | Ma ........................................ | 333/132 |
| 4,181,824   1/1980 | Seidel . | |
| 4,189,676   2/1980 | Arias et al. . | |
| 4,305,043  12/1981 | Ho et al. . | |
| 4,350,958   9/1982 | Pagnamenta . | |
| 4,397,037 *  8/1983 | Theriault ........................... | 455/188.2 |
| 4,455,537   6/1984 | La Prade et al. . | |
| 4,462,010 *  7/1984 | Strammello ......................... | 333/126 |
| 4,480,233  10/1984 | Juul . | |
| 4,647,871   3/1987 | Turner, Jr. . | |
| 4,694,421   9/1987 | Ogawa . | |
| 4,792,920  12/1988 | Ogawa . | |
| 4,829,567   5/1989 | Moisin . | |
| 4,864,644 *  9/1989 | Takahashi et al. .................. | 455/326 |
| 5,023,951   6/1991 | Kahn . | |
| 5,053,910  10/1991 | Goldstein . | |
| 5,180,999 *  1/1993 | Edwards .............................. | 333/175 |
| 5,253,291  10/1993 | Naseer et al. . | |
| 5,310,363   5/1994 | Brownell et al. . | |
| 5,471,178 * 11/1995 | Hickernell ............................ | 333/193 |
| 5,506,868   4/1996 | Cox et al. . | |
| 5,717,685   2/1998 | Abraham . | |
| 5,726,582   3/1998 | Hedberg . | |
| 5,732,345 *  3/1998 | Vice .................................... | 455/333 |
| 5,745,276   4/1998 | Ho et al. . | |
| 5,774,026   6/1998 | Cunin et al. . | |
| 5,838,527 * 11/1998 | Lawrence et al. ................... | 361/119 |
| 5,881,129   3/1999 | Chen et al. . | |
| 5,907,422   5/1999 | Ho et al. . | |
| 5,910,731 *  6/1999 | Polczynski ............................ | 326/30 |
| 5,973,568 * 10/1999 | Shapiro et al. ..................... | 333/295 |
| 6,091,966 *  7/2000 | Meadows ............................ | 455/553 |

* cited by examiner

Primary Examiner—Michael J. Sherry
(74) Attorney, Agent, or Firm—Robert E. Bushnell, Esq.

(57) ABSTRACT

An impedance matching circuit for a set-top box includes a diplexer at a preceding stage having a given output impedance, and a network interface having a given input impedance different from the output impedance of the diplexer. The impedance matching circuit is connected between the diplexer and the network interface, and matches the output impedance of the diplexer to the input impedance of the network interface. Further, the impedance matching circuit includes a transformer having a primary coil and a secondary coil connected to the network interface, a first resistor for connecting an output end of the diplexer to an end of the primary coil of the transformer, a second resistor for connecting another output end of the diplexer to another end of the primary coil of the transformer, and a third resistor connected in parallel with the primary coil of the transformer. In addition, the impedance matching circuit comprises a surge protection element, connected in parallel with the diplexer, for protecting the impedance matching circuit from a surge voltage output from the diplexer.

25 Claims, 2 Drawing Sheets

IMPEDANCE MATCHING CIRCUIT

CLAIM OF PRIORITY

This application makes reference to, incorporates the same herein, and claims all benefits accruing under 35 U.S.C. §119 from an application for IMPEDANCE MATCHING CIRCUIT earlier filed in the Korean Industrial Property Office on Jun. 12, 1998 and there duly assigned Serial No. 21901/1998.

BACKGROUND OF THE INVENTION

1. Technical Field

The present invention relates to an impedance matching circuit and, in particular, to a line impedance matching circuit.

2. Related Art

Impedance matching circuits are generally used to efficiently transfer energy at a junction point where electronic circuits having different characteristic impedances are connected to each other. This is accomplished by rendering the impedances seen on either side of the junction point identical. To this end, it is necessary to match line impedances and load impedances of the circuits. When the line impedances are matched, maximum power can be provided from the power supply. Such line impedance matching is necessary not only for a wire terminal but also for a wireless terminal, and the impedances are matched at 50, 75 and 100Ω according to the characteristics of the circuits. With the progress of the electronic and communication technologies, the consumers of electronic communication products demand more qualified services and, in particular, desire to be provided with various services by a single product. To accede to this demand, various electronic circuits having different characteristics have come to be provided in a single communication product. Accordingly, there is a demand for an impedance matching circuit capable of matching impedances which are different for the various kinds of services provided by the product.

The following patents are considered to be representative of the prior art relative to the invention disclosed herein, but are burdened by the disadvantages set forth herein:

U.S. Pat. No. 4,181,824 for a BALANCING IMPEDANCE CIRCUIT issued to Seidel; U.S. Pat. No. 4,189,676 for a SWITCHING SYSTEM UTILIZING FLEXIBLE CIRCUIT WITH TRANSMISSION LINE FOR MATCHED IMPEDANCE CONNECTIONS issued to Arias et al.; U.S. Pat. No. 4,305,043 for a COUPLER HAVING ARBITRARY IMPEDANCE TRANSFORMATION RATIO AND ARBITRARY COUPLING RATIO issued to Ho et al.; U.S. Pat. No. 4,350,958 for an IMPEDANCE MATCHING CIRCUITRY FOR RADIO FREQUENCY SIGNAL POWER AMPLIFIERS issued to Pagnamenta; U.S. Pat. No. 4,455,537 for a MICROWAVE CIRCUIT INTERCONNECT issued to La Prade et al.; U.S. Pat. No. 4,647,871 for an ADAPTIVE IMPEDANCE MISMATCH DETECTOR SYSTEM issued to Turner Jr.; U.S. Pat. No. 4,694,421 for an INTERFACE SYSTEM WHICH SELECTIVELY PROVIDES IMPEDANCE MATCHING BETWEEN A HOST COMPUTER AND A CONTROL CIRCUIT issued to Ogawa; U.S. Pat. No. 4,480,233 for a PLANAR MULTIPLE OSCILLATOR CIRCUIT issued to Juul; U.S. Pat. No. 4,792,920 for an INTERFACE PROVIDING IMPEDANCE MATCHING BY SELECTIVE CONNECTION OF A RESISTOR ARRAY TO A POWER SUPPLY issued to Ogawa; U.S. Pat. No. 4,829,567 for a LINE INTERFACE CIRCUIT issued to Moisin; U.S. Pat. No. 5,023,951 for an OPTICAL RECEIVERS issued to Kahn; U.S. Pat. No. 5,053,910 for a SURGE SUPPRESSOR FOR COAXIAL TRANSMISSION LINE issued to Goldstein; U.S. Pat. No. 5,253,291 for a HYBRID BALANCE AND COMBINATION CODEC FILTER CIRCUIT issued to Naseer et al.; U.S. Pat. No. 5,310,363 for an IMPEDANCE MATCHED REDUCED CROSS TALK ELECTRICAL CONNECTOR SYSTEM issued to Brownell et al.; U.S. Pat. No. 5,506,868 for a MODEM HAVING AN IMPROVED LINE INTERFACE CIRCUIT, IN PARTICULAR FOR A COMPUTER issued to Cox et al.; U.S. Pat. No. 5,717,685 for a TRANSFORMER COUPLER FOR COMMUNICATION OVER VARIOUS LINES issued to Abraham; U.S. Pat. No. 5,726,582 for a CONTROL CIRCUIT FOR KEEPING CONSTANT THE IMPEDANCE OF A TERMINATION NETWORK issued to Hedberg; U.S. Pat. No. 5,745,276 for a UNIVERSAL OPTICAL SIGNAL RECEIVER issued to Ho et al.; U.S. Pat. No. 5,774,026 for a HIGH FREQUENCY IMPEDANCE TRANSFORMER issued to Cunin et al.; U.S. Pat. No. 5,881,129 for a SELF-MONITORING LINE INTERFACE CIRCUIT issued to Chen et al.; and U.S. Pat. No. 5,907,422 for a UNIVERSAL OPTICAL SIGNAL RECEIVER issued to Ho et al.

SUMMARY OF THE INVENTION

It is an object of the present invention to provide an impedance matching circuit for matching different impedances in a communications system providing various services.

To achieve the above object, there is provided an impedance matching circuit for a set-top box including a diplexer at a preceding stage having a given output impedance, and a network interface having a given input impedance different from the output impedance of the diplexer. The impedance matching circuit is connected between the diplexer and the network interface, and matches the output impedance of the diplexer to the input impedance of the network interface.

Further, the impedance matching circuit includes: a transformer having a primary coil and a secondary coil connected to the network interface; a first resistor for connecting an output end of the diplexer to an end of the primary coil of the transformer; a second resistor for connecting another output end of the diplexer to another end of the primary coil of the transformer; and a third resistor connected in parallel with the primary coil of the transformer.

Further, the impedance matching circuit includes: a first coil connected between the diplexer and the first resistor; a second coil connected between the diplexer and the second resistor; a first capacitor connected between the first resistor and the primary coil of the transformer for cutting off a DC voltage therebetween; and a second capacitor connected between the second resistor and the primary coil of the transistor for cutting off a DC voltage therebetween. A composite impedance of the first and second coils cancels a composite impedance of the first and second capacitors.

In addition, the impedance matching circuit comprises a surge protection element, connected in parallel with the diplexer, for protecting the impedance matching circuit from a surge voltage output from the diplexer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
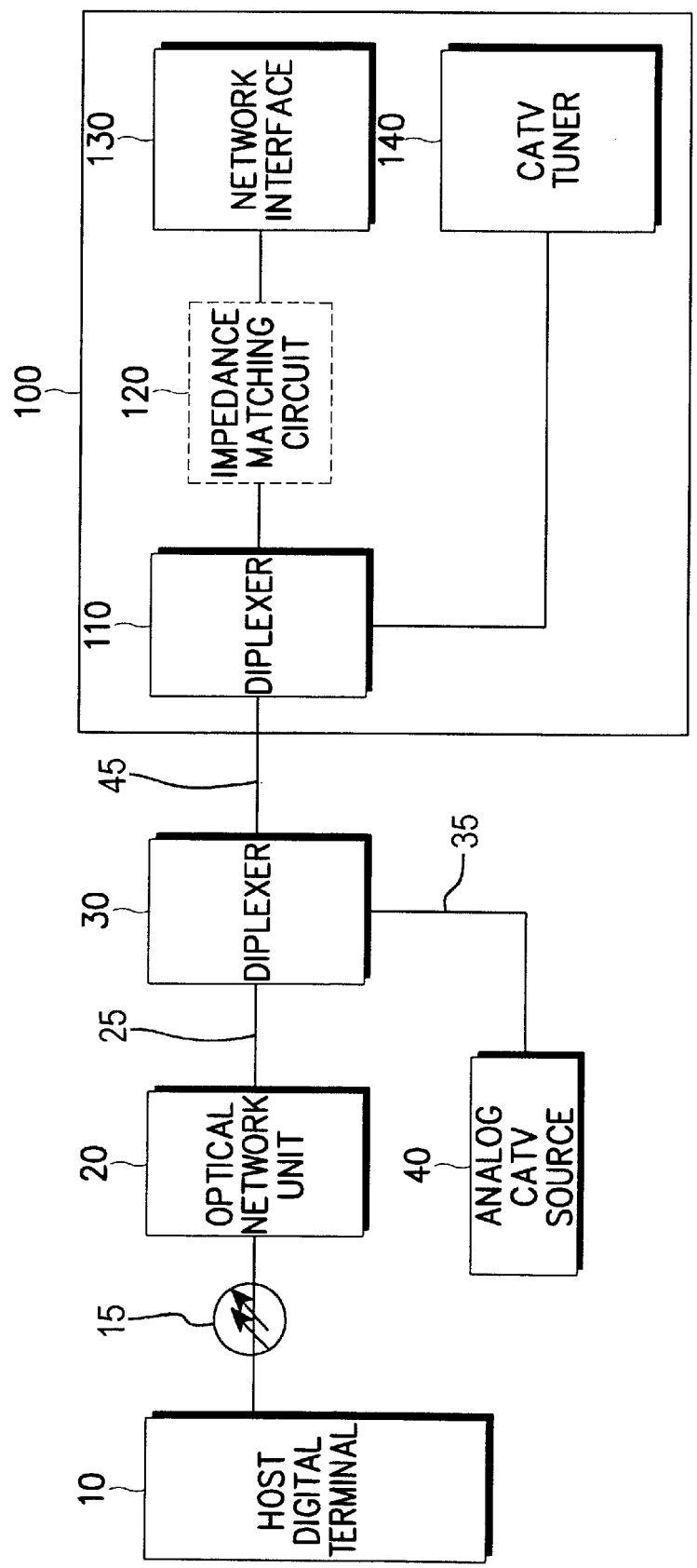
FIG. 1 is a block diagram illustrating a set-top box and a communication network connected thereto according to an embodiment of the present invention.

FIG. 1 illustrates a set-top box and a communication network connected thereto according to an embodiment of the present invention. In the figure, a host digital terminal 10 is connected to an end of a data communication network (e.g., the Internet). Also, the host digital terminal 10 is connected to an optical network unit 20 through an optical transmission line or medium 15, and transmits/receives data using optical signals. In the exemplary embodiment, the digital data is transmitted through the optical transmission line 15 at the frequency band of 6–40 MHz. The optical network unit 20 converts the data transmitted/received through the optical transmission medium 15 into electrical signals, and is connected to a diplexer 30 through a copper twist pair line 25. In addition, the diplexer 30 is connected to an analog cable television (CATV) source 40 through a coaxial cable 35. The analog CATV source 40 may be a base station or a TV station which transmits image data for an analog TV. The diplexer 30 multiplexes data received from the optical network unit 20 and the analog CATV source 40, and applies the multiplexed data to a set-top box 100 through a coaxial cable 45. In general, the analog TV uses a frequency band of 55–750 MHz. Therefore, the diplexer 30 transmits different data to the set-top box 100 through the same transmission line using different frequency bands.

In the set-top box 100, a diplexer 110 receives the data output from the external diplexer 30. The diplexer 110 separates the data received from the optical network unit 20 and the data received from the analog CATV source 40 according to their frequency bands. The separated data component received from the analog CATV source 40 is transferred to a CATV tuner 140, and the separated data component received from the optical network unit 20 is transferred to a network interface 130 via an impedance matching circuit 120 according to the present invention. The CATV tuner 140, connected to a TV set (not shown), selects broadcasting channels or tunes the TV set to a particular station. The network interface 130 is connected to a data processing device such as a computer, and interfaces the input/output data. Further, the network interface 130 is impedance-matched with the diplexer 110 by the impedance matching circuit 120 according to the present invention so that the input/output data can be communicated with maximum power.

Figure 2:
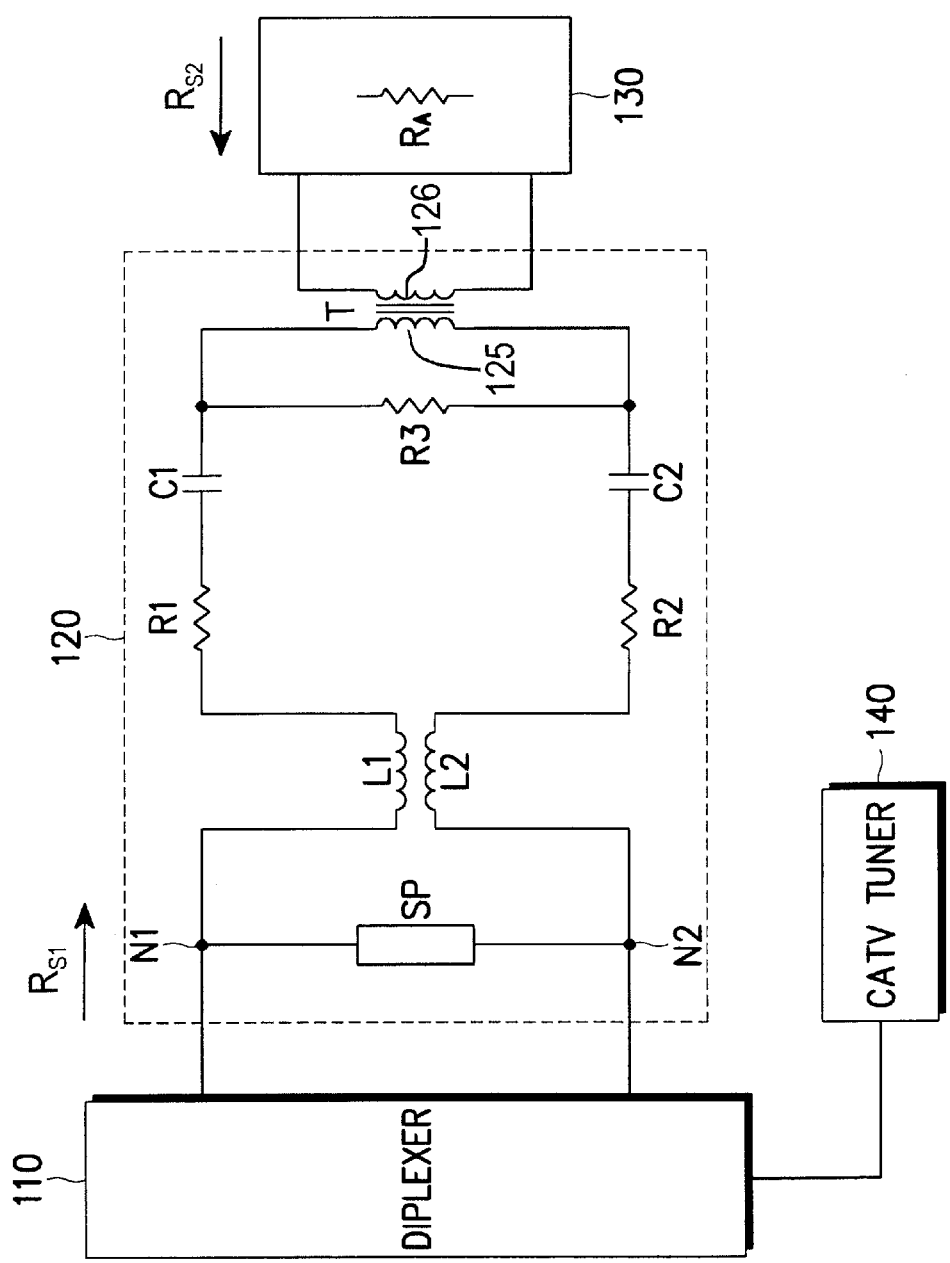
FIG. 2 is a detailed diagram illustrating the impedance matching circuit of FIG. 1 according to an embodiment of the present invention.

FIG. 2 illustrates a detailed circuit diagram of the impedance matching circuit 120 according to the present invention. Although the present invention will be described with reference to an embodiment composed of specific elements, it should and will be understood by those skilled in the art that other equivalent elements may be used in place of the specific elements disclosed herein without departing from the spirit and scope of the invention.

Referring to FIG. 2, a surge protection element SP for protecting the impedance matching A circuit 120 from a surge voltage is connected between first and second nodes N1 and N2 where the impedance matching circuit 120 is connected to the diplexer 110. A first coil L1, a first resistor R1 if and a first capacitor C1 are connected in series between the first node N1 and an end of a primary coil 125 of a transformer T. A second coil L2, a second resistor R2 and a second capacitor C2 are connected in series between the second node N2 and another end of the primary coil 125 of the transformer T. A secondary coil 126 of the transformer T is connected in parallel with the network interface 130. In FIG. 2, the network interface 130 is represented by an input impedance $R_A$ thereof as seen at the impedance matching circuit 120. Further, the diplexer 110 is connected to the CATV tuner 140.

A 300V surge protection element is used as the surge protection element SP. Thus, in the case where a telephone set is connected at a stage following the surge protection element SP, the impedance matching circuit 120 can be prevented from malfunction due to a ring voltage provided to the telephone set. The coils L1 and L2 prevent noise incoming from the diplexer 110, and the capacitors C1 and C2 cut off DC voltage from the diplexer 110. Also, the coils L1 and L2 and the capacitors C1 and C2 are constructed such that their impedances cancel each other.

The impedance matching circuit 120 has (1) an input impedance $R_{S1}$ seen at the diplexer 110 and directed into the network interface 130 and (2) an output impedance $R_{S2}$ seen at the network interface 130 and directed into the diplexer 110. In this specification, the invention is described with reference to a specific impedance and resistance by way of example only. A resistance $R_D$ of the diplexer 110 is set to 100Ω for impedance matching with the CATV tuner 140. In addition, a resistance of the network interface 130 is set to 75Ω for impedance matching.

On the assumption that the resistors R1 and R2 are 25Ω and that resistor R3 connected between both ends of the primary coil 125 of the transformer T is 150Ω, the input impedance will be considered. First, as seen at the input side, the resistor R3 is connected in parallel with a resistance $R_A$ of the network interface 130 through the transformer T. When a composite resistance of the parallel-connected resistors is $R_{SA}$, the total input impedance $R_{S1}$ is defined as a serial composite resistance of the first and second resistors R1 and R2 and the composite resistance $R_{SA}$. Here, the composite resistance $R_{SA}$ can be calculated by:

$$R_{SA} = \frac{R_3 \cdot R_A}{R_3 + R_A} \quad (1)$$

When calculated in accordance with equation (1), the composite resistance $R_{SA}$ becomes 50Ω. Therefore, the total input impedance $R_{S1}$ seen at the input side can be calculated by:

$$R_{S1} = R_1 + R_{SA} + R_2 \quad (2)$$

When calculated in accordance with equation (2), the total input impedance $R_{S1}$ seen at the input side becomes 100Ω. Accordingly, impedance matching is attained with the diplexer 110.

Next, a description will be made as to an output impedance as seen at the network interface 130 and directed into the diplexer 110. When seen at the network interface 130, the resistor R3 is first seen. A cascade of the resistor R1, the resistor $R_D$ of the diplexer 110 and the resistor R2 is connected in parallel with the resistor R3. A composite resistance $R_{SB}$ of the cascaded resistors $R_1$, $R_D$ and $R_2$ can be calculated by $$R_{SB}=R_1+R_D+R_2 \quad (3)$$

When calculated based on equation (3), the composite resistance $R_{SB}$ becomes 155Ω. In addition, a composite resistance $R_{S2}$ of the resistance $R_{SB}$ and the resistance of the third resistor R3 is given by:

$$R_{S2} = \frac{R_{SB} \cdot R_3}{R_{SB} + R_3} \quad (4)$$

When calculated based on equation (4), the total output resistance $R_{S2}$ becomes 75Ω. Therefore, impedance matching is attained with the network interface 130.

In this manner, the impedance matching circuit 120 matches an output impedance of a circuit at a preceding stage to an input impedance of a circuit at the following stage, thereby minimizing the power loss in transmitting/receiving data.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An impedance matching circuit for a set-top box including a diplexer disposed at a preceding stage and having an output impedance, and a network interface having an input impedance which is different from the output impedance of the diplexer;
   wherein said impedance matching circuit is connected between the diplexer and the network interface for matching the output impedance of the diplexer to the input impedance of the network interface; and
   wherein said impedance matching circuit comprises:
     a transformer having a primary coil and a secondary coil which is connected to the network interface;
     a first resistor for connecting a first output of the diplexer to a first input of the primary coil of the transformer;
     a second resistor for connecting a second output of the diplexer to a second input of the primary coil of the transformer; and
     a third resistor connected in parallel with the primary coil of the transformer.

2. The impedance matching circuit as claimed in claim 1, further comprising:
   a first coil connected between the first output of the diplexer and the first resistor;
   a second coil connected between the second output of the diplexer and the second resistor;
   a first capacitor connected between the first resistor and the first input of the primary coil of the transformer for cutting off a DC voltage therebetween; and
   a second capacitor connected between the second resistor and the second input of the primary coil of the transistor for cutting off a DC voltage therebetween;
   wherein a composite impedance of the first and second coils cancels a composite impedance of the first and second capacitors.

3. The impedance matching circuit as claimed in claim 2, further comprising a surge protection element connected in parallel with the diplexer for protecting the impedance matching circuit from a surge voltage output from the diplexer.

4. The impedance matching circuit as claimed in claim 3, wherein said surge protection element is connected between the first and second outputs of the diplexer.

5. The impedance matching circuit as claimed in claim 1, further comprising a surge protection element connected in parallel with the diplexer for protecting the impedance matching circuit from a surge voltage output from the diplexer.

6. The impedance matching circuit as claimed in claim 5, wherein said surge protection element is connected between the first and second outputs of the diplexer.

7. An impedance matching circuit for a set-top box including a diplexer disposed at a preceding stage and having an output impedance, and a network interface having an input impedance which is different from the output impedance of the diplexer;
   wherein said impedance matching circuit is connected between the diplexer and the network interface for matching the output impedance of the diplexer to the input impedance of the network interface;
   said circuit further comprising a surge protection element connected in parallel with the diplexer for protecting the impedance matching circuit from a surge voltage output from the diplexer.

8. The impedance matching circuit as claimed in claim 7, wherein said surge protection element is connected between the first and second outputs of the diplexer.

9. An impedance matching circuit for a set-top box including a diplexer disposed at a preceding stage and having an output impedance and a network interface having an input impedance which is different from the output impedance of the diplexer;
   wherein said impedance matching circuit is connected between the diplexer and the network interface for matching the output impedance of the diplexer to the input impedance of the network interface;
   said impedance matching circuit comprising:
     a transformer having a primary coil and a secondary coil which is connected to the network interface;
     a first resistor for connecting a first output of the diplexer to a first input of the primary coil of the transformer; and
     a second resistor for connecting a second output of the diplexer to a second input of the primary coil of the transformer.

10. The impedance matching circuit as claimed in claim 9, further comprising:
    a first coil connected between the first output of the diplexer and the first resistor;
    a second coil connected between the second output of the diplexer and the second resistor;
    a first capacitor connected between the first resistor and the first input of the primary coil of the transformer for cutting off a DC voltage therebetween; and
    a second capacitor connected between the second resistor and the second input of the primary coil of the transistor for cutting off a DC voltage therebetween;
    wherein a composite impedance of the first and second coils cancels a composite impedance of the first and second capacitors.

11. The impedance matching circuit as claimed in claim 10, further comprising a surge protection element connected in parallel with the diplexer for protecting the impedance matching circuit from a surge voltage output from the diplexer.

12. The impedance matching circuit as claimed in claim 11, wherein said surge protection element is connected between the first and second outputs of the diplexer.

13. The impedance matching circuit as claimed in claim 9, further comprising a surge protection element connected in parallel with the diplexer for protecting the impedance matching circuit from a surge voltage output from the diplexer.

14. The impedance matching circuit as claimed in claim 13, wherein said surge protection element is connected between the first and second outputs of the diplexer.

15. The impedance matching circuit as claimed in claim 9, further comprising a third resistor connected in parallel with the primary coil of the transformer.

16. An impedance matching circuit for a set-top box including a diplexer disposed at a preceding stage and having an output impedance, and a network interface having an input impedance which is different from the output impedance of the diplexer;

wherein said impedance matching circuit is connected between the diplexer and the network interface for matching the output impedance of the diplexer to the input impedance of the network interface;

said impedance matching circuit comprising:
a transformer having a primary coil and a secondary coil which is connected to the network interface;
first resistor means for connecting a first output of the diplexer to a first input of the primary coil of the transformer; and
second resistor means for connecting a second output of the diplexer to a second input of the primary coil of the transformer.

17. The impedance matching circuit as claimed in claim 16, further comprising:
a first coil connected between the first output of the diplexer and the first resistor means;
a second coil connected between the second output of the diplexer and the second resistor means;
first capacitor means connected between the first resistor means and the first input of the primary coil of the transformer for cutting off a DC voltage therebetween; and
second capacitor means connected between the second resistor means and the second input of the primary coil of the transistor for cutting off a DC voltage therebetween;
wherein a composite impedance of the first and second coils cancels a composite impedance of the first and second capacitor means.

18. The impedance matching circuit as claimed in claim 17, further comprising surge protection means connected in parallel with the diplexer for protecting the impedance matching circuit from a surge voltage output from the diplexer.

19. The impedance matching circuit as claimed in claim 18, wherein said surge protection means is connected between the first and second outputs of the diplexer.

20. The impedance matching circuit as claimed in claim 16, further comprising surge protection means connected in parallel with the diplexer for protecting the impedance matching circuit from a surge voltage output from the diplexer.

21. The impedance matching circuit as claimed in claim 20, wherein said surge protection means is connected between the first and second outputs of the diplexer.

22. The impedance matching circuit as claimed in claim 16, further comprising a resistor connected in parallel with the primary coil of the transformer.

23. An impedance matching circuit for a set-top box including a diplexer disposed at a preceding stage and having an output impedance, and a network interface having an input impedance which is different from the output impedance of the diplexer;

wherein said impedance matching circuit is connected between the diplexer and the network interface for matching the output impedance of the diplexer to the input impedance of the network interface;

said circuit further comprising:
a transformer having a primary coil and a secondary coil which is connected to the network interface; and
a resistor connected in parallel with the primary coil of the transformer.

24. The impedance matching circuit as claimed in claim 23, further comprising a surge protection element connected in parallel with the diplexer for protecting the impedance matching circuit from a surge voltage output from the diplexer.

25. The impedance matching circuit as claimed in claim 24, wherein said surge protection element is connected between first and second outputs of the diplexer.

* * * * *